(12) United States Patent
Akiyama

(10) Patent No.: US 11,095,265 B2
(45) Date of Patent: Aug. 17, 2021

(54) MATCHING CIRCUIT AND COMMUNICATION DEVICE

(71) Applicant: Murata Manufacturing Co., Ltd., Nagaokakyo (JP)

(72) Inventor: Hisashi Akiyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/831,871

(22) Filed: Mar. 27, 2020

(65) Prior Publication Data

US 2020/0228086 A1 Jul. 16, 2020

Related U.S. Application Data

(63) Continuation of application No. PCT/JP2018/034140, filed on Sep. 14, 2018.

(30) Foreign Application Priority Data

Oct. 24, 2017 (JP) .............................. JP2017-204886

(51) Int. Cl.
*H03H 7/38* (2006.01)
*H03F 1/56* (2006.01)
(Continued)

(52) U.S. Cl.
CPC ............... *H03H 7/38* (2013.01); *H03F 1/565* (2013.01); *H03F 3/21* (2013.01); *H03H 7/09* (2013.01);
(Continued)

(58) Field of Classification Search
CPC combination set(s) only.
See application file for complete search history.

(56) References Cited

U.S. PATENT DOCUMENTS 3,710,260 A * 1/1973 Wright ................. H03H 11/365
455/291
6,232,727 B1 * 5/2001 Chee ................... H05B 41/2985
315/291
(Continued)

FOREIGN PATENT DOCUMENTS

JP 2017-084898 A 5/2017
WO 2011/090080 A1 7/2011
(Continued)

OTHER PUBLICATIONS

Official Communication issued in International Patent Application No. PCT/JP2018/034140, dated Nov. 13, 2018.

*Primary Examiner* — Junpeng Chen
(74) *Attorney, Agent, or Firm* — Keating & Bennett, LLP

(57) ABSTRACT

A matching circuit includes first and second ports, an autotransformer, and first and second capacitors. The autotransformer includes a first terminal coupled to a first port, a second terminal coupled to a second port, and a common terminal coupled to a reference potential, and includes a series parasitic inductor and a parallel parasitic inductor. The first capacitor is coupled in shunt to the second terminal, and defines a low pass filter together with the series parasitic inductor. The second capacitor is coupled in series between the first port and the first terminal, and defines a high pass filter together with the parallel parasitic inductor.

19 Claims, 13 Drawing Sheets

(51) Int. Cl.
*H03F 3/21* (2006.01)
*H03H 7/09* (2006.01)
*H04B 1/04* (2006.01)

(52) U.S. Cl.
CPC ......... *H04B 1/04* (2013.01); *H03F 2200/387* (2013.01); *H04B 2001/0408* (2013.01)

(56) References Cited

U.S. PATENT DOCUMENTS

| | | |
|---|---|---|
| 2011/0309994 A1 | 12/2011 | Kato et al. |
| 2014/0065980 A1 | 3/2014 | Ueki et al. |
| 2015/0371762 A1 | 12/2015 | Ishizuka |
| 2016/0240924 A1 | 8/2016 | Ishizuka |
| 2017/0084998 A1 | 3/2017 | Ishizuka |
| 2017/0118841 A1 | 4/2017 | Ino |
| 2017/0133999 A1* | 5/2017 | Ishizuka ................. H03H 9/64 |
| 2017/0302246 A1 | 10/2017 | Ishizuka |

FOREIGN PATENT DOCUMENTS

| | | |
|---|---|---|
| WO | 2012/153691 A1 | 11/2012 |
| WO | 2014/155873 A1 | 10/2014 |
| WO | 2015/064138 A1 | 5/2015 |
| WO | 2015/076008 A1 | 5/2015 |
| WO | 2015/178204 A1 | 11/2015 |
| WO | 2016/114182 A1 | 7/2016 |
| WO | 2016/152603 A1 | 9/2016 |

* cited by examiner

MATCHING CIRCUIT AND COMMUNICATION DEVICE

CROSS REFERENCE TO RELATED APPLICATIONS

This application claims the benefit of priority to Japanese Patent Application No. 2017-204886 filed on Oct. 24, 2017 and is a Continuation Application of PCT Application No. PCT/JP2018/034140 filed on Sep. 14, 2018. The entire contents of each application are hereby incorporated herein by reference.

BACKGROUND OF THE INVENTION

1. Field of the Invention

The present invention relates to a matching circuit in a high-frequency circuit such as an antenna matching circuit, and a communication device including the matching circuit.

2. Description of the Related Art

For example, a matching circuit for matching an output impedance of a power amplifier to impedance of an antenna is provided between the power amplifier and the antenna provided in a mobile phone terminal. Such a matching circuit is disclosed in, for example, Japanese Unexamined Patent Application Publication No. 2017-84898.

FIG. 15A is a diagram illustrating an example of a matching circuit shown in Japanese Unexamined Patent Application Publication No. 2017-84898. In FIG. 15A, a power amplifier 40 amplifies a transmission signal input from a radio frequency integrated circuit (RFIC) or the like. A matching circuit 30 matches an output impedance of the power amplifier 40 with impedance of an antenna 1.

In the example shown in FIG. 15A, the matching circuit is configured with an inductor L31 coupled in series and capacitors C31 and C32 coupled in shunt. An existing matching circuit of an output impedance of a general power amplifier is configured with such an LC filter circuit. Further, as shown in FIG. 15B, the LC filter circuit may be configured as a multi-stage structure as required.

The matching circuit of the LC filter circuit configuration has a narrow frequency range in which good impedance matching is obtained. Further, since the number of elements necessary for impedance matching is large, there is a tendency that a loss is large.

On the other hand, an impedance matching circuit having an autotransformer structure is disclosed in International Publication No. WO 2011/090080. FIG. 16 is a circuit diagram of the matching circuit shown in International Publication No. WO 2011/090080. For example, a port P1 of the matching circuit is coupled to an output portion of a power amplifier, and an antenna is coupled to a port P2 of the matching circuit.

In the matching circuit having an autotransformer structure as shown in FIG. 16, by determining a value of a parasitic reactance component of the autotransformer, a transformer ratio can be varied so as to follow impedance frequency characteristics of the antenna, and thus impedance matching over a wide band can be achieved.

In a case where such a matching circuit is applied between a power amplifier and an antenna, for example, a low pass filter or a band pass filter is often provided in a front or rear stage of the matching circuit in order to reduce or prevent harmonic components generated in the power amplifier from being radiated from the antenna.

Since the filter is configured with an LC circuit, losses caused by an inductor and a capacitor inevitably increase by providing the filter. In the high-frequency circuit that requires the impedance matching circuit and the filter, an increase in loss due to the provision of the filter is not limited to a circuit provided between an output portion of the power amplifier and the antenna, but is common among high-frequency circuits each of which includes an impedance matching circuit and a filter.

SUMMARY OF THE INVENTION

Preferred embodiments of the present invention provide matching circuits that each achieve low loss and an impedance matching function over a wide band and a filter function, and communication devices including such matching circuits.

A matching circuit according to a preferred embodiment of the present invention matches impedance between a first port side impedance and a second port side impedance, and the matching circuit includes an autotransformer coupled between the first port and the second port and including a first terminal, a second terminal and a common terminal, and a first capacitor coupled in shunt to the second terminal and defining a low pass filter together with a portion of the autotransformer.

With the above configuration, while impedance matching characteristics are maintained over a wide band due to the autotransformer structure, the portion of the autotransformer defines and functions as a portion of the low pass filter, so that the low pass filter includes a significantly smaller number of elements, thus reducing a loss.

In a matching circuit according to a preferred embodiment of the present invention, for example, the autotransformer includes a series parasitic inductance component, and the portion of the autotransformer is the series parasitic inductance component.

In a matching circuit according to a preferred embodiment of the present invention, for example, the autotransformer includes a parallel parasitic inductance component, and is provided with a second capacitor coupled in series between the first port and the first terminal and defines a high pass filter together with the parallel parasitic inductance component.

A matching circuit according to a preferred embodiment of the present invention matches impedance between a first port side impedance and a second port side impedance, and the matching circuit includes an autotransformer coupled between the first port and the second port and including a first terminal, a second terminal and a common terminal, and a second capacitor coupled in series between the first port and the first terminal and defining a high pass filter together with a portion of the autotransformer.

With the above configuration, while impedance matching characteristics are maintained over a wide band due to an autotransformer structure, a portion of the autotransformer defines and functions as a portion of the high pass filter, so that a high pass filter includes a substantially smaller number of elements, thus reducing a loss.

In a matching circuit according to a preferred embodiment of the present invention, for example, the autotransformer includes a parallel parasitic inductance component, and the portion of the autotransformer is the parallel parasitic inductance component.

In a matching circuit according to a preferred embodiment of the present invention, for example, the autotransformer includes a series parasitic inductance component, and is provided with a first capacitor coupled in shunt to the second terminal and defines a low pass filter together with the series parasitic inductance component.

In a matching circuit according to a preferred embodiment of the present invention, the low pass filter may include a first inductor coupled between the second terminal and the second port. With this configuration, a required inductance of the inductor coupled in series is easily determined.

In a matching circuit according to a preferred embodiment of the present invention, for example, one of the first port and the second port is coupled to a power amplifier, and the other is coupled to an antenna.

In a matching circuit according to a preferred embodiment of the present invention, the high pass filter may include a second inductor coupled between the first terminal and the common terminal. With this configuration, a required inductance of the inductor coupled in parallel is easily determined.

In a matching circuit according to a preferred embodiment of the present invention, for example, one of the first port and the second port is coupled to a communication circuit, and the other is coupled to an antenna.

In a matching circuit according to a preferred embodiment of the present invention, it is preferable that the autotransformer is provided with a first coil and a second coil which are magnetically coupled to each other, the first coil is coupled between the first terminal and the second terminal, and the second coil is coupled between the second terminal and the common terminal.

When the autotransformer is configured as described above, the capacitor (first capacitor) is disposed on a high impedance side, so that a loss caused by the first capacitor is able to be reduced or prevented to a small extent. In addition, when the autotransformer is configured as described above, since the capacitor (second capacitor) is disposed on a low impedance side, an equivalent series inductance (ESL) of the capacitor is reduced or prevented by a negative inductance generated equivalently by the autotransformer.

In a matching circuit according to a preferred embodiment of the present invention, it is preferable that the autotransformer is a single component made by laminating a plurality of insulating base materials on which coil conductor patterns are formed, and that a coil opening of the first coil and a coil opening of the second coil overlap each other when viewed from a direction of the lamination. With this configuration, the matching circuit is able to be treated as a chip component, and the impedance matching and the filter function are able to be provided only by mounting the matching circuit on a circuit board together with other chip components.

A communication device according to a preferred embodiment of the present invention includes a communication circuit, an antenna, and a matching circuit which is coupled between the communication circuit and the antenna to match impedance between a communication circuit side impedance and an antenna side impedance, wherein the matching circuit matches impedance between a first port side impedance and a second port side impedance, and includes an autotransformer coupled between the first port and the second port and including a first terminal, a second terminal and a common terminal, and a first capacitor coupled between the second terminal and the common terminal and defining a low pass filter together with a portion of the autotransformer.

In a communication device according to a preferred embodiment of the present invention, for example, the autotransformer includes a series parasitic inductance component, and a portion of the autotransformer is the serial parasitic inductance component.

A communication device according to a preferred embodiment of the present invention includes a communication circuit, an antenna, and a matching circuit which is coupled between the communication circuit and the antenna to match impedance between the communication circuit side impedance and the antenna side impedance, wherein the matching circuit matches impedance between a first port side impedance and a second port side impedance, and includes an autotransformer coupled between the first port and the second port and including a first terminal, a second terminal and a common terminal, and a second capacitor coupled in series between the first port and the first terminal and defining a high pass filter together with a portion of the autotransformer.

In a communication device according to a preferred embodiment of the present invention, for example, the autotransformer includes a parallel parasitic inductance, and a portion of the autotransformer is the parallel parasitic inductance.

In a matching circuit according to a preferred embodiment of the present invention, for example, the communication device includes a power amplifier coupled between the communication circuit and the matching circuit.

With the above-described configuration, the communication device with a low loss is obtained while impedance matching between the communication circuit and the antenna is maintained over a wide band.

According to preferred embodiments of the present invention, matching circuits that achieve a low loss and an impedance matching function over a wide band and a filter function, and communication devices including the matching circuits are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
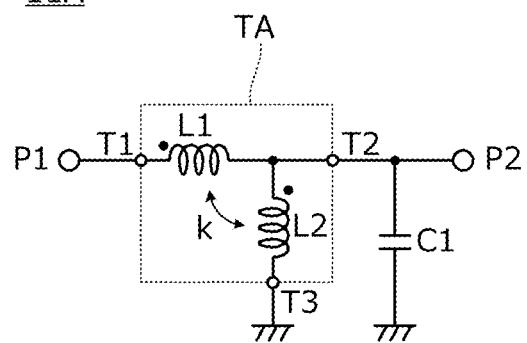
FIG. 1A is a circuit diagram of a matching circuit 11A according to a first preferred embodiment of the present invention.

Hereinafter, preferred embodiments of the present invention will be described by using specific examples with reference to the drawings. In the drawings, the same reference characters are used to denote the same or corresponding portions. While the preferred embodiments are shown, for sake of convenience, in a separate manner in consideration of ease of explanation or understanding of points, partial substitutions or combinations of configurations shown in the different preferred embodiments are possible. In the following description of the second and subsequent preferred embodiments, description of the same or similar matters as those of the first preferred embodiment will be omitted, and only different points will be described. In particular, similar advantageous effects by similar configurations will not be described in every preferred embodiment.

First Preferred Embodiment

A first preferred embodiment of the present invention is an example of an impedance matching circuit having low pass filter characteristics.

Figure 1B:
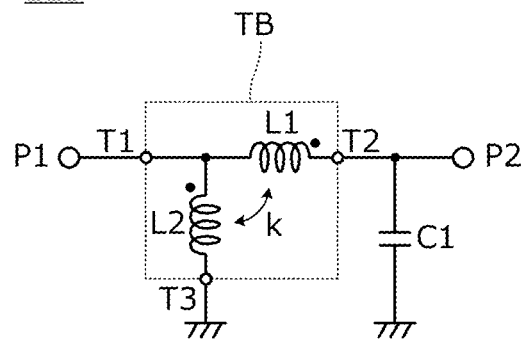
FIG. 1B is a circuit diagram of a matching circuit 11B according to the first preferred embodiment of the present invention.

FIG. 1A is a circuit diagram of the matching circuit 11A according to the first preferred embodiment, and FIG. 1B is a circuit diagram of the matching circuit 11B according to the first preferred embodiment. The matching circuits 11A and 11B have a function of matching impedance between the first port P1 side impedance and the second port P2 side impedance, and a low pass filter function. The matching circuit 11A includes an autotransformer TA and a first capacitor C1. The matching circuit 11B includes the autotransformer TB and the first capacitor C1.

Each of the autotransformers TA and TB includes a first terminal T1 coupled to the first port P1, a second terminal T2 coupled to the second port P2, and a common terminal T3 coupled to a reference potential (ground).

The autotransformer TA of the matching circuit 11A includes a first coil L1 coupled between a first terminal T1 and a second terminal T2, and a second coil L2 coupled between the second terminal T2 and the common terminal T3. The autotransformer TB of the matching circuit 11B includes a first coil L1 coupled between the first terminal T1 and a second terminal T2, and the second coil L2 coupled between the first terminal T1 and the common terminal T3. The first coil L1 and the second coil L2 are coupled to each other with a coupling coefficient k.

In the matching circuits 11A and 11B, the first capacitor C1 is coupled in shunt between the second terminal T2 and the ground.

Figure 2A:
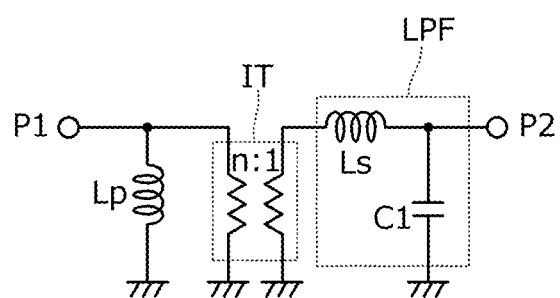
FIGS. 2A to 2C are equivalent circuit diagrams of the matching circuit 11A shown in FIG. 1A or the matching circuit 11B shown in FIG. 1B.
Figure 2B:
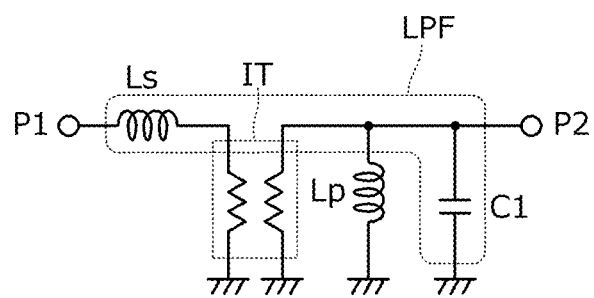
Figure 2C:
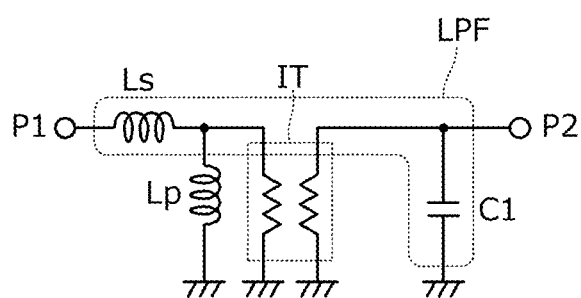

FIGS. 2A to 2C are equivalent circuit diagrams of the matching circuit 11A shown in FIG. 1A or the matching circuit 11B shown in FIG. 1B. That is, both of the matching circuits 11A and 11B can be represented by the equivalent circuit of any one of FIGS. 2A to 2C. However, in cases where a series parasitic inductor Ls and a parallel parasitic inductor Lp are on a primary side or on a secondary side, these inductances are different depending on a transformer ratio of an ideal transformer.

The autotransformers TA and TB include a series parasitic inductance component represented by the series parasitic inductor Ls and a parallel parasitic inductance component represented by the parallel parasitic inductor Lp. That is, the series parasitic inductance component represented by the series parasitic inductor Ls and the parallel parasitic inductance component represented by the parallel parasitic inductor Lp are a portion of each of the autotransformers TA and TB. Further, the autotransformers TA and TB are represented by an ideal transformer IT, the series parasitic inductor Ls, and the parallel parasitic inductor Lp in an equivalent circuit in which parasitic components are isolated from each other.

Here, when a self-inductance of the first coil L1 is represented by L1, a self-inductance of the second coil L2 is represented by L2, a mutual inductance of the first coil L1 and the second coil L2 is represented by M, an inductance of the series parasitic inductor Ls is represented by Ls, and an inductance of the parallel parasitic inductor Lp is represented by Lp, the inductance of each parasitic component is expressed by the following relationships:

$M = k\sqrt{L1 \cdot L2}$
$n = (L1+L2+2M)/(L2+M)$
$Ls = \{(1-k^2)L1 \cdot L2\}/(L1+L2+2M)$
$Lp = L1+L2+2M$ In any of the expressions shown in FIGS. 2A to 2C, a low pass filter LPF is defined by the first capacitor C1 and the series parasitic inductor Ls.

That is, since the series parasitic inductor Ls of each of the autotransformers TA and TB is used as a portion of the low pass filter LPF, a low pass filter includes a small number of elements. As a result, compared to a case where an inductor is coupled to the outside for the low pass filter, for example, a loss caused by the inductor is not generated, so that the loss can be reduced as a whole.

Figure 3A:
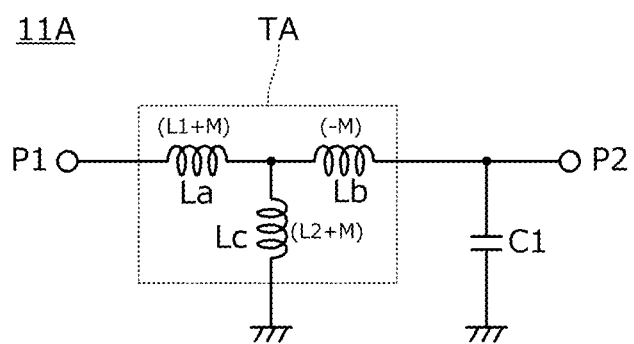
FIGS. 3A and 3B are another equivalent circuit diagram of the matching circuit 11A according to the first preferred embodiment of the present invention and another equivalent circuit diagram of the matching circuit 11B according to the first preferred embodiment of the present invention, respectively.
Figure 3B:
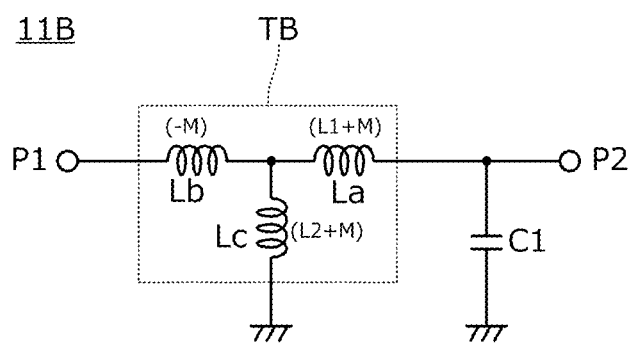

FIGS. 3A and 3B are an equivalent circuit diagram of the matching circuit 11A according to the present preferred embodiment and another equivalent circuit diagram of the matching circuit 11B according to the present preferred embodiment, respectively. In this example, each of the autotransformers TA and TB is represented by a three-terminal equivalent circuit in which the mutual inductance M due to magnetic field coupling between the first coil L1 and the second coil L2 is clearly specified.

When the self-inductance of the first coil L1 is represented by L1, the self-inductance of the second coil L2 is represented by L2, and the mutual inductance between the first coil L1 and the second coil L2 is represented by M in FIGS. 1A and 1B, an inductance of an inductor La is (L1+M), an inductance of an inductor Lb is (−M), and an inductance of an inductor Lc is (L2+M) in FIGS. 3A and 3B.

An impedance conversion ratio between the first port P1 and the second port P2 of the matching circuit 11B shown in FIG. 3B is (−M+L2+M):(L1+M+L2+M): =L2:(L1+L2+2M).

That is, the first port is a low impedance side, and the second port P2 is a high impedance side.

According to the matching circuit 11B, since the capacitor (first capacitor C1) is in parallel on the high impedance side, a current flowing through the first capacitor C1 is relatively small. Accordingly, an increase in loss due to the first capacitor C1 is small.

Figure 4A:
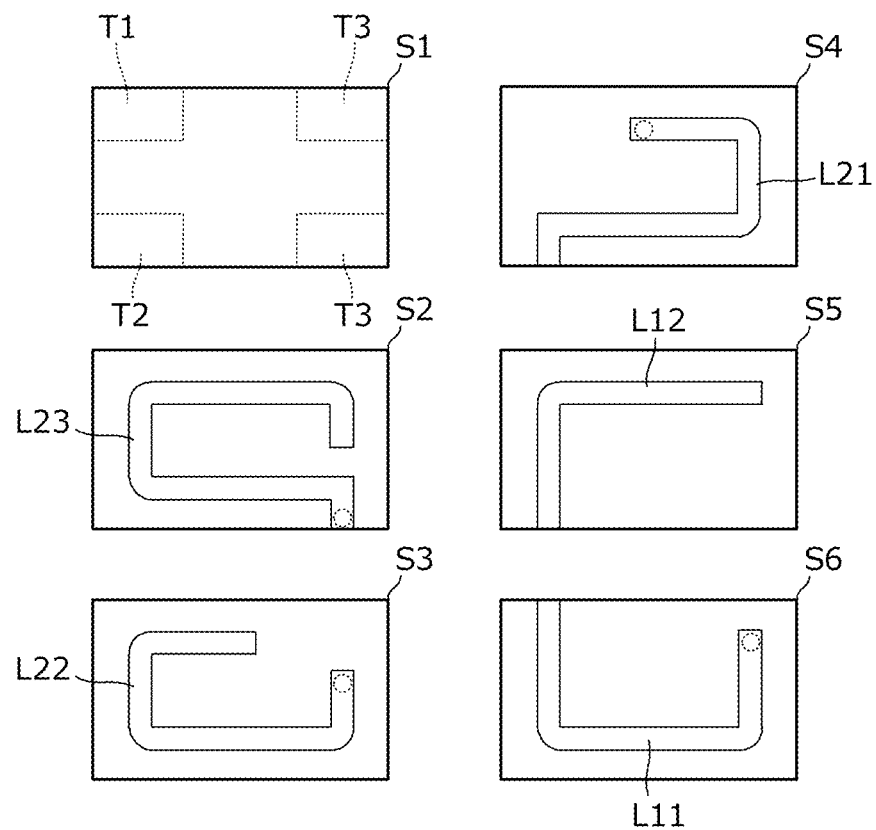
FIG. 4A is a plan view of each layer of an autotransformer TA or TB.
Figure 4B:
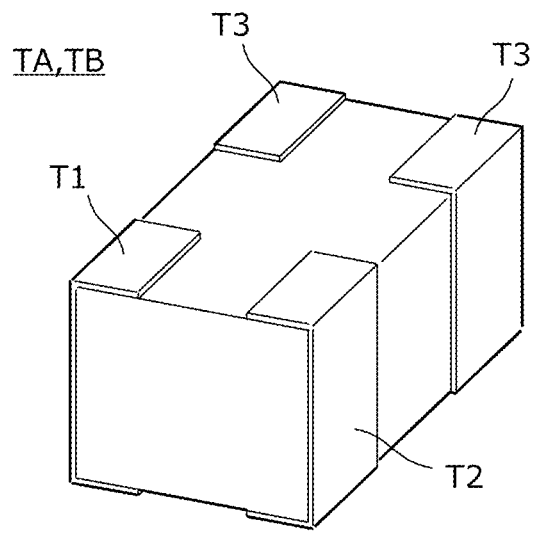
FIG. 4B is an external perspective view of the autotransformer TA or TB.

Next, an example of structures of the autotransformers TA and TB will be described. FIG. 4A is a plan view of each layer of the autotransformer TA or TB. FIG. 4B is an external perspective view of the autotransformer TA or TB. In FIGS. 1A and 1B, a sign of the autotransformer is separated into TA and TB, but only a circuit configuration to be coupled to the outside is differentiated between TA and TB, and the same or substantially the same components are preferably used.

Each of the autotransformers TA and TB is a surface-mounted chip component, and includes a plurality of insulating base material layers including insulating base material layers S1 to S6. Each of these insulating base material layers is a non-magnetic ceramic base material layer or a non-magnetic resin base material layer. Various conductor patterns are provided on the base material layers S1 to S6. The "various conductor patterns" include not only a conductor pattern provided on a surface of a base material layer but also an interlayer coupling conductor. The interlayer coupling conductor includes not only a via conductor but also an end surface electrode provided on an end surface of a multilayer body as shown in FIG. 4B.

The base material S1 corresponds to a mounting surface (the lowermost layer) of the multilayer body. On the base material layer S1, the first terminal T1, the second terminal T2, and the common terminal (ground terminal) T3 are provided.

A loop-shaped conductor pattern L23 preferably of about 11/12 turns, for example, is provided on the base material layer S2. A loop-shaped conductor pattern L22 preferably of about 9/12 turns, for example, is provided on the base material layer S3. A loop-shaped conductor pattern L21 preferably of about 8/12 turns, for example, is provided on the base material layer S4. The conductor patterns L21, L22 and L23 coupled in series define the second coil (the second coil L2 in FIGS. 1A and 1B).

A loop-shaped conductor pattern L12 preferably of about ½ turns, for example, is provided on the base material layer S5. A loop-shaped conductor pattern L11 preferably of about 8/12 turns, for example, is provided on the base material layer S6. The conductor patterns L11 and L12 coupled in series define the first coil (the first coil L1 in FIGS. 1A and 1B).

In this manner, each of the autotransformers TA and TB is a single component defined by laminating the plurality of insulating base material layers on which the coil conductor patterns are provided. As seen from the direction of the lamination, the autotransformers TA and TB overlap a coil opening of the first coil L1 and a coil opening of the second coil L2. Further, preferably, the first coil L1 and the second coil L2 have the same or substantially the same winding axis, and inner and outer diameter dimensions thereof are the same or substantially the same.

With this configuration, the autotransformer can be treated as a chip component, and the matching circuit can be defined only by mounting the autotransformer and the first capacitor on a circuit board.

Figure 5A:
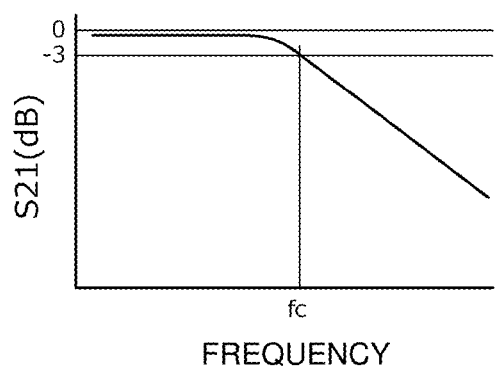
FIG. 5A is a diagram showing frequency characteristics of a passing loss between a first port P1 and a second port P2 of each of the matching circuits 11A and 11B.
Figure 5B:
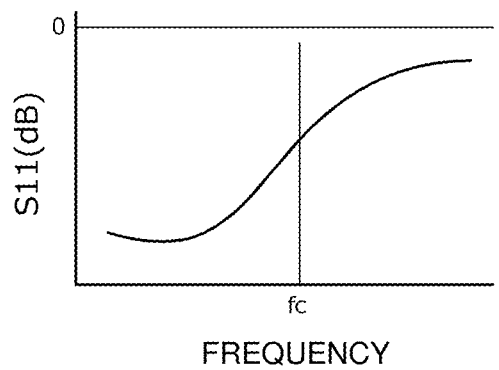
FIG. 5B is a diagram showing frequency characteristics of a return loss seen from the first port P1 of each of the matching circuits 11A and 11B.

Next, filter characteristics of the matching circuits 11A and 11B according to the present preferred embodiment will be described. FIG. 5A is a diagram showing frequency characteristics of a passing loss (S21) between the first port P1 and the second port P2 of each of the matching circuits 11A and 11B, and FIG. 5B is a diagram showing frequency characteristics of a return loss (S11) seen from the first port P1 of each of the matching circuits 11A and 11B. In FIG. 5A, a frequency at which the passing loss is about −3 dB is a cutoff frequency fc of a low pass filter. The cutoff frequency fc is higher than an upper limit frequency in a frequency band of a high-frequency signal input/output to/from the first port P1 and the second port P2 of each of the matching circuits 11A and 11B. That is, the high-frequency signal intentionally input from the first port P1 (second port P2) is hardly attenuated by the low pass filter, and is output from the second port (first port P1), whereas a harmonic component (frequency component higher than the high-frequency signal intentionally input) unintentionally mixed into the first port P1 (second port P2) is reduced or prevented by the low pass filter. In other words, the matching circuit according to the present preferred embodiment includes the low pass filter to reduce or prevent the harmonic component different from the high-frequency signal input/output to/from the first port P1 and the second port P2.

The cutoff frequency fc is preferably lower than twice a communication frequency. As a result, for example, when a power amplifier is coupled to one port and an antenna is coupled to the other port, radiation from the antenna of a harmonic component caused by distortion characteristics of the power amplifier is reduced or prevented. In this case, the harmonic component generated by the distortion characteristics of the power amplifier corresponds to the harmonic component described above and unintentionally mixed into the port.

Second Preferred Embodiment

A second preferred embodiment of the present invention is an example of an impedance matching circuit having high pass filter characteristics.

Figure 6A:
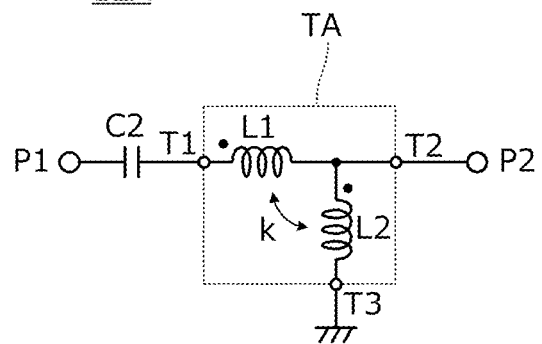
FIG. 6A is a circuit diagram of a matching circuit 12A according to a second preferred embodiment of the present invention.
Figure 6B:
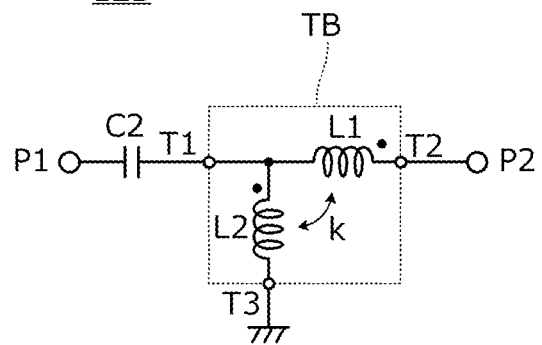
FIG. 6B is a circuit diagram of a matching circuit 12B according to the second preferred embodiment of the present invention.

FIG. 6A is a circuit diagram of the matching circuit 12A according to the second preferred embodiment, and FIG. 6B is a circuit diagram of the matching circuit 12B according to the second preferred embodiment. The matching circuits 12A and 12B have a function of matching impedance between the first port P1 side impedance and the second port P2 side impedance, and a high pass filter function. The matching circuit 12A includes the autotransformer TA and a second capacitor C2. The matching circuit 12B includes the autotransformer TB and the second capacitor C2.

The configurations of the autotransformers TA and TB are as described in the first preferred embodiment.

In the matching circuits 12A and 12B, the second capacitor C2 is coupled in series between the first terminal T1 and the first port P1.

Figure 7A:
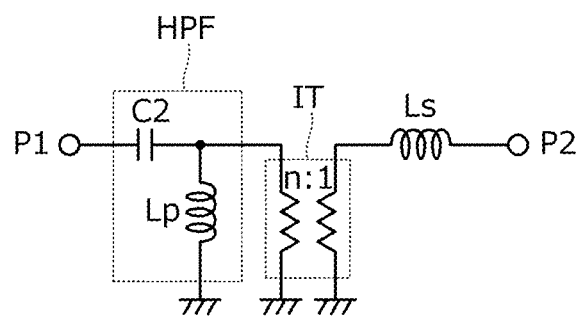
FIGS. 7A to 7C are equivalent circuit diagrams of the matching circuit 12A shown in FIG. 6A or the matching circuit 12B shown in FIG. 6B.
Figure 7B:
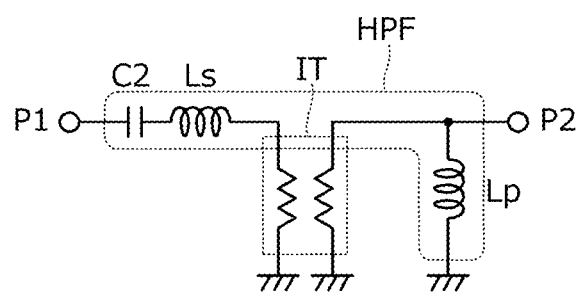
Figure 7C:
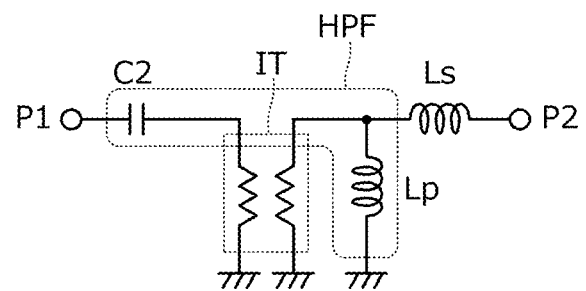

All of FIGS. 7A to 7C are equivalent circuit diagrams of the matching circuit 12A shown in FIG. 6A or the matching circuit 12B shown in FIG. 6B. That is, both of the matching circuits 12A and 12B can be represented by the equivalent circuit of any one of FIGS. 7A to 7C.

In any of the expressions shown in FIGS. 7A to 7C, a high pass filter HPF includes the second capacitor C2 and the parallel parasitic inductor Lp.

That is, since the parallel parasitic inductor Lp of the autotransformers TA and TB are used as a portion of the high pass filter HPF, the high pass filter can be defined by a small number of elements. As compared with a case where the inductor is coupled to the outside for the high pass filter, for example, a loss caused by the inductor is not generated, thus reducing a loss as a whole.

Figure 8A:
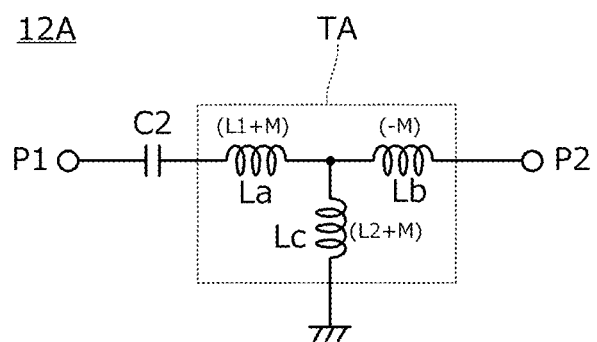
FIGS. 8A and 8B are another equivalent circuit diagram of the matching circuit 12A according to the second preferred embodiment of the present invention and another equivalent circuit diagram of the matching circuit 12B according to the second preferred embodiment of the present invention, respectively.
Figure 8B:
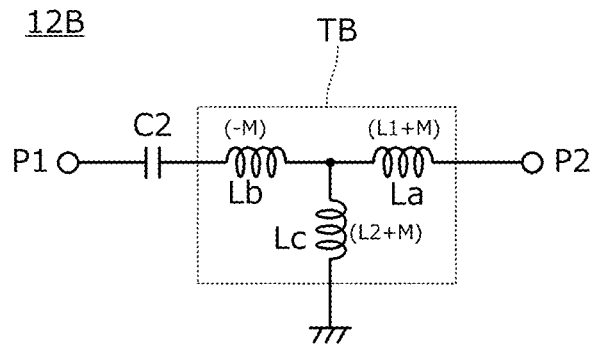

FIGS. 8A and 8B are another equivalent circuit diagram of the matching circuit 12A of the present preferred embodiment and another equivalent circuit diagram of the matching circuit 12B of the present preferred embodiment. In this example, each of the autotransformers TA and TB is represented by a three-terminal equivalent circuit in which the mutual inductance M due to magnetic field coupling between the first coil L1 and the second coil L2 is clearly specified.

In the configuration shown in FIG. 8B, since the second capacitor C2 is coupled in series to the inductor Lb having an equivalent negative inductor (−M), an equivalent series inductance (ESL) of the second capacitor C2 is reduced or prevented by being combined with the negative inductance (−M). As a result, frequency dependence is reduced, and the return loss is low over a wide band.

Figure 9A:
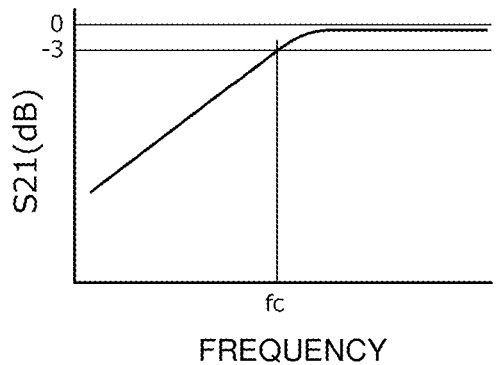
FIG. 9A is a diagram showing frequency characteristics of a passing loss between the first port P1 and the second port P2 of each of the matching circuits 12A and 12B.
Figure 9B:
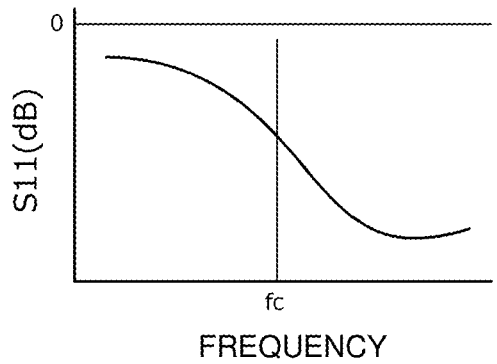
FIG. 9B is a diagram showing frequency characteristics of a return loss seen from the first port P1 of each of the matching circuits 12A and 12B.

Next, filter characteristics of the matching circuits 12A and 12B according to the present preferred embodiment will be described. FIG. 9A is a diagram showing frequency characteristics of a passing loss (S21) between the first port P1 and the second port P2 of each of the matching circuits 12A and 12B, and FIG. 9B is a diagram showing frequency characteristics of a return loss (S11) seen from the first port P1 of each of the matching circuits 12A and 12B. In FIG. 9A, a frequency at which the passing loss is about −3 dB is a cutoff frequency fc of a high pass filter. The cutoff frequency fc is preferably lower than a lower limit frequency in a frequency band of a high-frequency signal input/output to/from the first port P1 and the second port P2 of each of the matching circuits 12A and 12B. That is, the high-frequency signal intentionally input from the first port P1 (second port P2) is hardly attenuated by the high pass filter, and is output from the second port (first port P1), whereas a subharmonic component (frequency component lower than the high-frequency signal intentionally input/output) unintentionally mixed into the first port P1 (second port P2) is reduced or prevented by the high pass filter. In other words, the matching circuit of the present preferred embodiment includes the high pass filter to reduce or prevent the subharmonic component different from the high-frequency signal input/output to/from the first port P1 and the second port P2.

The cut-off frequency fc is preferably, for example, equal to or higher than about ½ times the communication frequency. Thus, for example, when a communication circuit is coupled to one port and an antenna is coupled to the other port, radiation from the antenna of a subharmonic component generated in the communication circuit is reduced or prevented. In this case, the subharmonic component generated in the communication circuit corresponds to the subharmonic component unintentionally mixed into the port.

Third Preferred Embodiment

A third preferred embodiment of the present invention is an example of an impedance matching circuit having band pass filter characteristics.

Figure 10A:
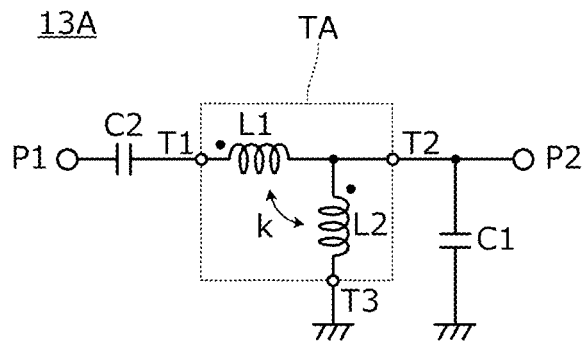
FIG. 10A is a circuit diagram of a matching circuit 13A according to a third preferred embodiment of the present invention.
Figure 10B:
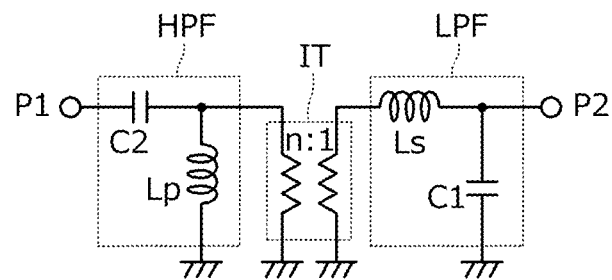
FIG. 10B is an equivalent circuit diagram of the matching circuit 13A.

FIG. 10A is a circuit diagram of the matching circuit 13A according to the third preferred embodiment, and FIG. 10B is an equivalent circuit diagram of the matching circuit 13A. The matching circuit 13A has a function of matching impedance between the first port P1 side impedance and the second port P2 side impedance, and a band pass filter function. The matching circuit 13A includes the autotransformer TA, the first capacitor C1, and the second capacitor C2.

The configuration of the autotransformer TA described above is as described in the first preferred embodiment.

In the matching circuit 13A, the first capacitor C1 is coupled in shunt between the second terminal T2 and the ground, and the second capacitor C2 is coupled in series between the first terminal T1 and the first port P1.

In FIG. 10B, the low pass filter LPF includes the first capacitor C1 and the series parasitic inductor Ls. Further, the high pass filter HPF includes the second capacitor C2 and the parallel parasitic inductor Lp. The cutoff frequency of the low pass filter LPF is preferably higher than the frequency band of the high-frequency signal, and the cutoff frequency of the high pass filter HPF is lower than the frequency band of the high-frequency signal. Therefore, band pass filter characteristics are provided between the first port P1 and the second port P2.

Figure 11A:
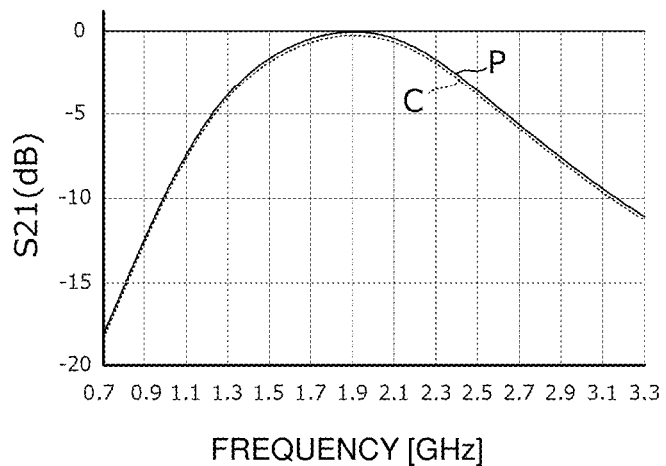
FIGS. 11A and 11B are diagrams showing frequency characteristics of a passing loss between the first port P1 and the second port P2 of the matching circuit 13A.
Figure 11B:
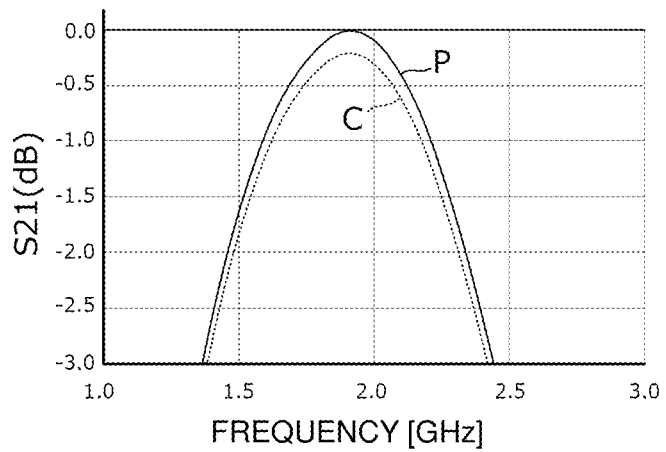
Figure 11C:
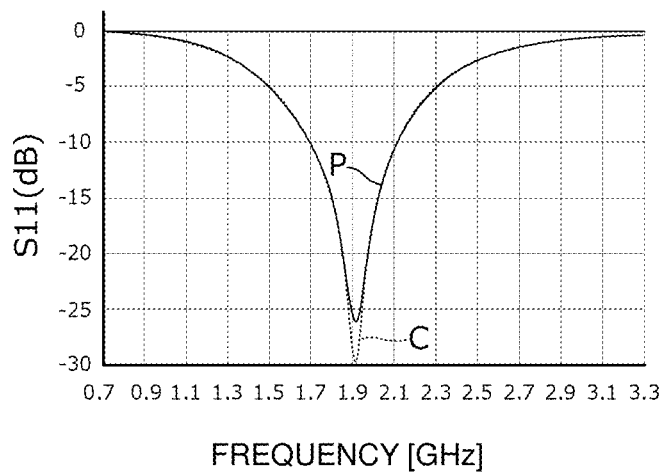
FIG. 11C is a diagram showing frequency characteristics of a return loss seen from the first port P1 of the matching circuit 13A.

FIGS. 11A and 11B are diagrams showing frequency characteristics of a passing loss (S21) between the first port P1 and the second port P2 of the matching circuit 13A, and FIG. 11C is a diagram showing frequency characteristics of a return loss (S11) seen from the first port P1 of the matching circuit 13A. In FIGS. 11A to 11C, a characteristic line P is characteristics of the present preferred embodiment, and a characteristic line C is characteristics of a matching circuit of a comparative example.

Figure 17:
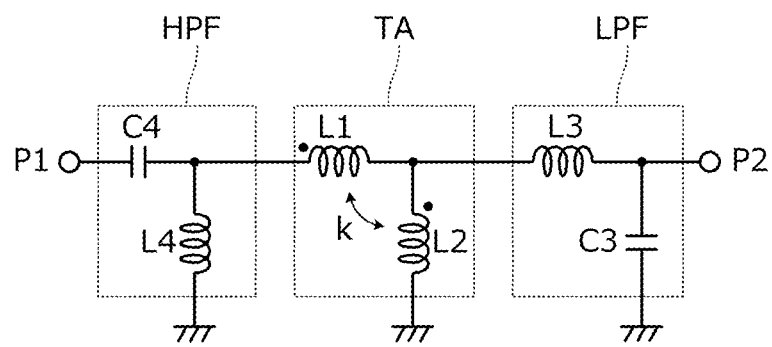
FIG. 17 is a circuit diagram of a matching circuit as a comparative example with respect to the matching circuit in the third preferred embodiment of the present invention.

Here, the matching circuit of the comparative example is shown in FIG. 17. In FIG. 17, a capacitor C3 and an inductor L3 define the low pass filter LPF, and a capacitor C4 and an inductor L4 define the high pass filter HPF. That is, the matching circuit of the comparative example is obtained by adding, to an impedance matching circuit by using the autotransformer TA, the low pass filter LPF and the high pass filter HPF which are separately provided from the impedance matching circuit.

Values of the respective elements shown in FIG. 10A are preferably, for example, as follows:

L1=about 0.5 nH
L2=about 7.0 nH
k=about 0.7
C1=about 8.2 pF
C2=about 1.8 pF

Impedance of an RFIC coupled to the first port P1 is preferably, for example, about 50Ω, and impedance of the antenna coupled to the second port is preferably, for example, about 3Ω.

Values of the respective elements shown in FIG. 17 are as follows:

L1=about 0.5 nH
L2=about 7.0 nH
k=about 0.7
C3=about 4.9 pF
C4=about 3.0 pF
L3=about 0.3 nH
L4=about 6.1 nH Further, a series equivalent resistance (ESR) of each inductor is calculated by the following equation.

$$R = 2\pi f L / Q$$

f: frequency
L: inductance

Q values of the inductors L3 and L4 are Q=about 60, and Q values of the first coil L1 and the second coil are Q=about 30.

An impedance conversion ratio of the autotransformer TA of the matching circuit 13A according to the present preferred embodiment is different from an impedance conversion ratio between the first port P1 and the second port P2. That is, since a predetermined impedance conversion ratio is obtained as an entire circuit by adding the first capacitor C1 or the second capacitor C2 defining a filter, it is possible to reduce not only the number of elements but also impedance deviation due to the addition of the first capacitor or the second capacitor for forming the filter, as compared with a case where a predetermined impedance conversion ratio is determined for the autotransformer alone and a filter is added to the autotransformer. In addition, a return loss is reduced.

With the matching circuit 13A according to the present preferred embodiment, as shown in FIGS. 11A and 11B, it is possible to pass a frequency band of, for example, about 1700 MHz to about 2100 MHz inclusive and to attenuate the other frequency bands. Further, as shown in FIG. 11B, it was discovered that a passing loss can be reduced, compared with the matching circuit of the comparative example.

Also in the third preferred embodiment, the autotransformer may be configured as the autotransformer TB shown in FIG. 1B and FIG. 6B.

Fourth Preferred Embodiment

In a fourth preferred embodiment of the present invention, an example of a matching circuit to which an inductor is further coupled will be shown.

Figure 12A:
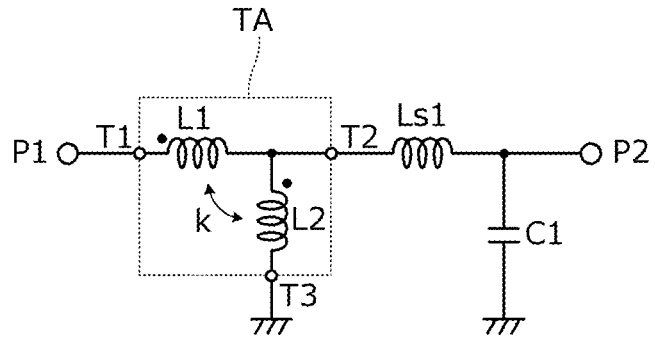
FIG. 12A is a circuit diagram of a matching circuit 14A according to a fourth preferred embodiment of the present invention.
Figure 12B:
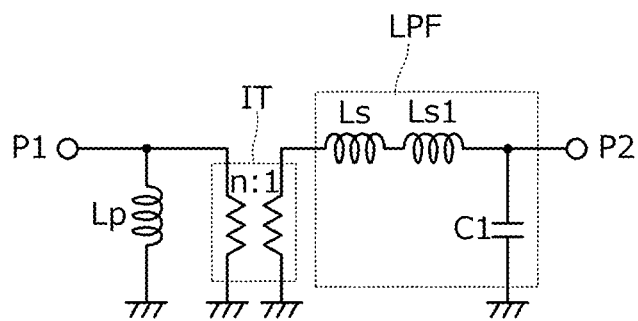
FIG. 12B is an equivalent circuit diagram of the matching circuit 14A.

FIG. 12A is a circuit diagram of the matching circuit 14A according to the fourth preferred embodiment, and FIG. 12B is an equivalent circuit diagram of the matching circuit 14A. The matching circuit 14A has a function of matching impedance between the first port P1 side impedance and the second port P2 side impedance, and a low pass filter function. The matching circuit 14A includes the autotransformer TA, the first capacitor C1, and a first inductor Ls1.

The configuration of the autotransformer TA described above is as described in the first preferred embodiment.

In FIG. 12B, the low pass filter LPF includes the series parasitic inductor Ls, the first inductor Ls1, and the first capacitor C1.

Figure 13A:
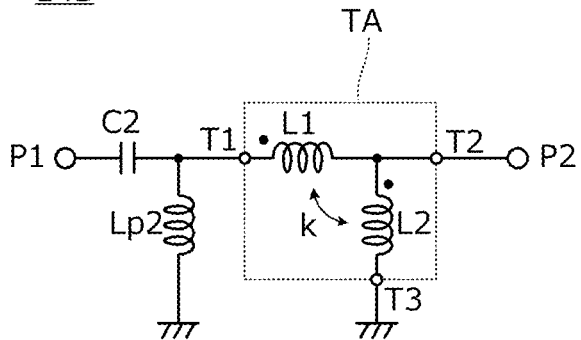
FIG. 13A is a circuit diagram of another matching circuit 14B according to the fourth preferred embodiment of the present invention.
Figure 13B:
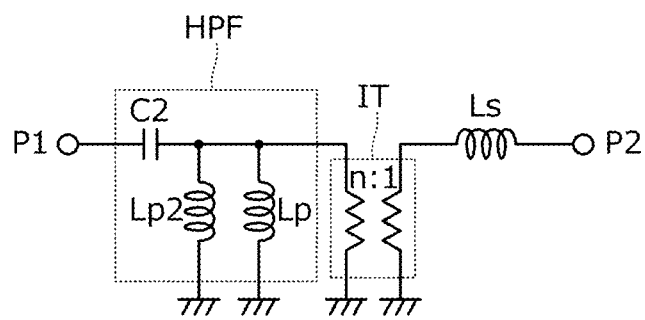
FIG. 13B is an equivalent circuit diagram of the matching circuit 14B.

FIG. 13A is a circuit diagram of another matching circuit 14B according to the fourth preferred embodiment, and FIG. 13B is an equivalent circuit diagram of the matching circuit 14B. The matching circuit 14B has a function of matching impedance between the first port P1 side impedance and the second port P2 side impedance, and a high pass filter function. The matching circuit 14B includes the autotransformer TA, the second capacitor C2, and a second inductor Lp2.

The configuration of the autotransformer TA described above is as described in the first preferred embodiment.

In FIG. 13B, the high pass filter HPF includes the parallel parasitic inductor Lp, the second inductor Lp2, and the second capacitor C2.

As shown in the present preferred embodiment, the first inductor Ls1 may be coupled to the outside so as to be coupled in series to the series parasitic inductor Ls of the autotransformer TA. Similarly, the second inductor Lp2 may be coupled to the outside so as to be coupled in parallel to the parallel parasitic inductor Lp of the autotransformer TA.

According to the present preferred embodiment, an inductor coupled in series in a low pass filter portion is easily set to a required inductance. Similarly, an inductor coupled in parallel in a high pass filter portion is easily set to a required inductance.

Also in the fourth preferred embodiment, the autotransformer may be configured as the autotransformer TB shown in FIG. 1B and FIG. 6B.

Further, band pass filter characteristics may be provided by adding the second capacitor C2 to the matching circuit 14A shown in FIG. 12A or by adding the first capacitor C1 to the matching circuit 14B shown in FIG. 13A. Further, the second capacitor C2 and the second inductor Lp2 may be added to the matching circuit 14A shown in FIG. 12A, or the first capacitor C1 and the first inductor Ls1 may be added to the matching circuit 14B shown in FIG. 13A.

Fifth Preferred Embodiment

In a fifth preferred embodiment of the present invention, an example of a communication device will be described.

Figure 14:
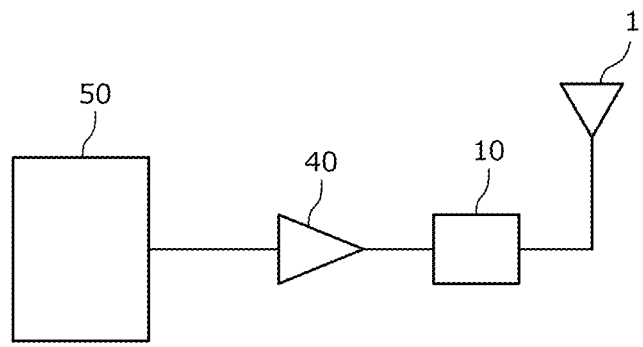
FIG. 14 is a block diagram of a communication device 100 according to a fifth preferred embodiment of the present invention.
Figure 15A:
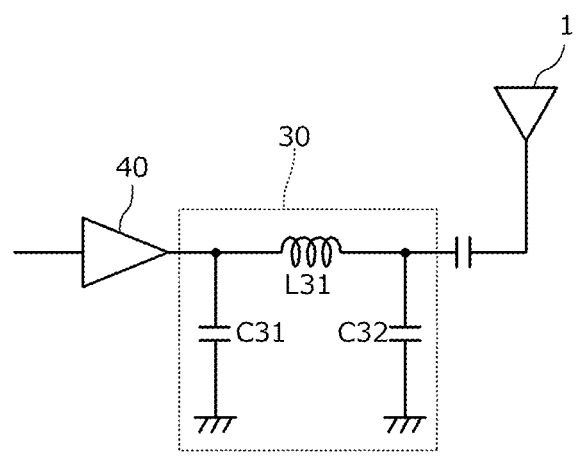
FIG. 15A is a diagram illustrating an example of a matching circuit shown in Japanese Unexamined Patent Application Publication No. 2017-84898
Figure 15B:
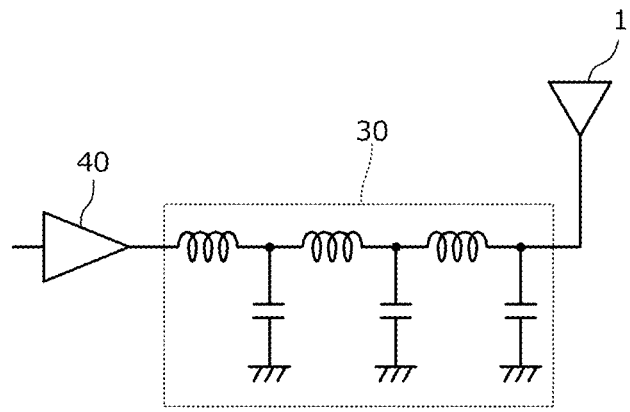
FIG. 15B is a diagram illustrating an example of a matching circuit in which an LC filter circuit is formed in a multistage configuration.
Figure 16:
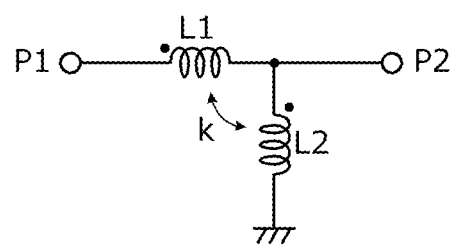
FIG. 16 is a circuit diagram of the matching circuit shown in International Publication No. WO 2011/090080.

FIG. 14 is a block diagram of a communication device 100 according to the fifth preferred embodiment. The communication device 100 according to the present preferred embodiment includes the antenna 1, a matching circuit 10, the power amplifier 40, and an RFIC (communication circuit) 50. The matching circuit 10 and the power amplifier 40 are coupled between the antenna 1 and the RFIC (communication circuit) 50, and the power amplifier 40 is coupled between the RFIC 50 and the matching circuit 10. Also, a configuration of the matching circuit 10 is that of the matching circuit shown in each preferred embodiment described above. The RFIC 50 includes a transmission circuit for a low band (for example, about 700 MHz to about 1.0 GHz) and a high band (for example, about 1.4 GHz to about 2.7 GHz). The antenna 1 preferably includes, for example, a monopole antenna, an inverted-L antenna, an inverted-F antenna, and the like corresponding to the low band and the high band. Note that a reception circuit system is not shown in FIG. 14.

The elements described above are preferably housed in one housing. For example, the matching circuit 10, the power amplifier 40, and the RFIC 50 are mounted on a printed wiring board, and the printed wiring board is housed in the housing. The antenna 1 may be mounted on the printed wiring board or may be disposed on an inner surface of the housing.

With the configuration described above, a communication device with a low loss can be obtained while maintaining impedance matching between the communication circuit and the antenna over a wide band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A matching circuit for matching impedance between a first port side impedance and a second port side impedance, the matching circuit comprising:
   an autotransformer coupled between the first port and the second port and including a first terminal, a second terminal and a common terminal; and
   a second capacitor coupled in series between the first port and the first terminal and defining a high pass filter together with a portion of the autotransformer; wherein
   the second capacitor is coupled in series with at least a portion of the autotransformer.

2. The matching circuit according to claim 1, wherein the autotransformer includes a parallel parasitic inductance component, and a portion of the autotransformer defines the parallel parasitic inductance component.

3. The matching circuit according to claim 1, wherein the autotransformer includes a series parasitic inductance component, and includes a first capacitor coupled in shunt to the second terminal and defining a low pass filter together with the series parasitic inductance component.

4. The matching circuit according to claim 1, wherein the low pass filter includes a first inductor coupled between the second terminal and the second port.

5. The matching circuit according to claim 1, wherein one of the first port and the second port is coupled to a power amplifier, and another one of the first port and the second port is coupled to an antenna.

6. The matching circuit according to claim 1, wherein the high pass filter includes a second inductor coupled between the first terminal and the common terminal.

7. The matching circuit according to claim 1, wherein one of the first port and the second port is coupled to a communication circuit, and another one of the first port and the second port is coupled to an antenna.

8. The matching circuit according to claim 1, wherein
   the autotransformer includes a first coil and a second coil that are magnetically coupled to each other;
   the first coil is coupled between the first terminal and the second terminal; and
   the second coil is coupled between the second terminal and the common terminal.

9. The matching circuit according to claim 8, wherein
   the autotransformer is a single component defined by a laminate including a plurality of insulating base material layers on which coil conductor patterns are provided; and
   a coil opening of the first coil and a coil opening of the second coil overlap each other when viewed from a lamination direction of the laminate.

10. A communication device comprising:
    a communication circuit;
    an antenna; and
    a matching circuit coupled between the communication circuit and the antenna to match impedance between the communication circuit side impedance and the antenna side impedance; wherein
    the matching circuit matches impedances between a first port and a second port, and includes:
      an autotransformer coupled between the first port and the second port and including a first terminal, a second terminal, and a common terminal; and
      a second capacitor coupled in series between the first port and the first terminal and defining a high pass filter together with a portion of the autotransformer; and
    the second capacitor is coupled in series with at least a portion of the autotransformer.

11. The communication device according to claim 10, wherein
    the autotransformer includes a parallel parasitic inductance component, and a portion of the autotransformer defines the parallel parasitic inductance component.

12. The communication device according to claim 10, further comprising a power amplifier coupled between the communication circuit and the matching circuit.

13. The communication device according to claim 10, wherein the autotransformer includes a series parasitic inductance component, and includes a first capacitor coupled in shunt to the second terminal and defining a low pass filter together with the series parasitic inductance component.

14. The communication device according to claim 10, wherein the low pass filter includes a first inductor coupled between the second terminal and the second port.

15. The communication device according to claim 10, wherein one of the first port and the second port is coupled to a power amplifier, and another one of the first port and the second port is coupled to the antenna.

16. The communication device according to claim 10, wherein the high pass filter includes a second inductor coupled between the first terminal and the common terminal.

17. The communication device according to claim 10, wherein one of the first port and the second port is coupled to the communication circuit, and another one of the first port and the second port is coupled to the antenna.

18. The communication device according to claim 10, wherein
    the autotransformer includes a first coil and a second coil that are magnetically coupled to each other;
    the first coil is coupled between the first terminal and the second terminal; and
    the second coil is coupled between the second terminal and the common terminal.

19. The communication device according to claim 18, wherein
    the autotransformer is a single component defined by a laminate including a plurality of insulating base material layers on which coil conductor patterns are provided; and
    a coil opening of the first coil and a coil opening of the second coil overlap each other when viewed from a lamination direction of the laminate.

* * * * *